(12) United States Patent
Ko et al.

(10) Patent No.: US 6,370,067 B1
(45) Date of Patent: Apr. 9, 2002

(54) AUTOMATIC CONFIGURATION OF DELAY PARAMETERS IN A DYNAMIC MEMORY CONTROLLER

(75) Inventors: Ka-pui Ko, Milpitas; Isaac H. Wong, Fremont; Keith V. Ngo, Gilroy; Jau-Wen Ren, Saratoga; Jiinyuan Lee, San Jose, all of CA (US)

(73) Assignee: Ishoni Networks, Inc., Santa Clara, CA (US)

( * ) Notice: Subject to any disclaimer, the term of this patent is extended or adjusted under 35 U.S.C. 154(b) by 0 days.

(21) Appl. No.: 09/772,111

(22) Filed: Jan. 25, 2001

(51) Int. Cl.$^7$ .................................................. G11C 7/00
(52) U.S. Cl. .................... 365/194; 365/233; 365/201
(58) Field of Search .................................. 365/194, 233, 365/189.12, 201, 230.06, 230.08

(56) References Cited

U.S. PATENT DOCUMENTS

| | | | |
|---|---|---|---|
| 6,137,734 A | 10/2000 | Schoner et al. | 365/194 |
| 6,141,265 A | * 10/2000 | Jeon | 365/194 |

* cited by examiner

*Primary Examiner*—David Nelms
*Assistant Examiner*—David Lam
(74) *Attorney, Agent, or Firm*—Skjerven Morrill MacPherson LLP; Jon W. Hallman; Omkar K. Suryadevara

(57) ABSTRACT

A memory controller configured according to a delay pair for communicating with a memory device automatically selects optimal delay pairs by testing whether successful communication exists at various values for the delay pairs. The resulting set of delay pairs allowing successful communication are divided into a boundary set and non-boundary set. An optimal delay pair from the non-boundary set is chosen according to its relationship to delay pairs in the boundary set.

5 Claims, 6 Drawing Sheets

AUTOMATIC CONFIGURATION OF DELAY PARAMETERS IN A DYNAMIC MEMORY CONTROLLER

FIELD OF THE INVENTION

This invention relates to dynamic memory controllers, and more particularly to a system for automatic selection of optimum delays for a dynamic memory controller.

DESCRIPTION OF RELATED ART

A typical system-on-a-chip system has a multi-function processor, a FLASH ROM device and a SDRAM device. The multi-function processor commonly includes a CPU core, a memory controller, and I/O modules. In addition to storing the boot image of the operating system, the FLASH ROM contains the delays required for proper setup of the memory controller interfacing with the SDRAM device. An SDRAM device is a type of RAM memory having two or more memory arrays that are interleaved in such a way that one array can be accessed while the other array prepares for access. The internal operations of an SDRAM device are synchronized to a clock signal provided by the memory controller. To permit the SDRAM to synchronize with the memory controller's system clock, a delay on the clock signal from the memory controller to the SDRAM and also a delay on the latching of the data signal returned from the SDRAM may be required. The delays may thus be denoted as transmit and receive delays, respectively. Typically, during the design of a system, an engineer manually finds the proper values for the transmit and receive delays, which are then burned into the FLASH ROM. This manual process is laborious and time-consuming, leading to the development of memory controllers that automatically adjust the delays to achieve proper timing. U.S. Pat. No. 6,137,734 discloses one such memory controller. It automatically searches through various combinations of transmit and receive delay pairs to determine whether successful memory read and write operations are achieved if the memory controller is configured according to each particular delay pair. The resulting collection of tested delay pairs, having either successful or failing results, may be arranged according to the delay values to form what is known in the art as a "shmoo" plot. A sample shmoo plot is shown in FIG. 1. Note that selection of an optimal delay pair will avoid pairs adjacent to the edge of the shmoo plot. These delay pairs, although a memory controller configured according to them will communicate successfully with its SDPAM, are close enough to failing delay values that small changes in operating conditions could cause a memory controller choosing such an operating point to fail to synchronize with its SDRAM device. U.S. Pat. No. 6,137,734 discloses an algorithm to select an optimal delay pair. This algorithm, however may still pick operating points close to the edge of the shmoo plot. For example, consider the shmoo plot of FIG. 1. The algorithm locates a line 5 parallel to the "x" axis (corresponding to the transmit delay) that includes the maximum number of passing points in the shmoo plot. Similarly, the algorithm selects a line 8 parallel to the "y" axis (corresponding to the receive delay) that includes the maximum number of passing points in the shmoo plot. The intersection 10 of these lines indicates the optimal selection according to this algorithm. However, for many shmoo shapes such as that shown in FIG. 1, this intersection may be located at the edge of the shmoo plot, far from the true optimal location 15.

Thus, there is a need in the art for a dynamic memory controller that automatically adjusts its delay values using a robust algorithm to ensure the selection of an optimal delay pair.

SUMMARY

In accordance with one aspect of the invention, a method is provided of automatically selecting optimal delay pairs for configuring a memory controller according to the delay pair so it may communicate with a memory device. Various selected delay pairs are tested by the memory controller to determine whether communication with the memory device is successful. Delay pairs permitting successful communication are divided into a boundary set and a non-boundary set. The optimal delay pair is selected from the non-boundary set according to its relationship to the delay pairs in the boundary set.

BRIEF DESCRIPTION OF THE DRAWINGS

FIG. 3b illustrates the circle of largest radius within the shmoo plot of FIG. 3a.

DETAILED DESCRIPTION

Figure 1:
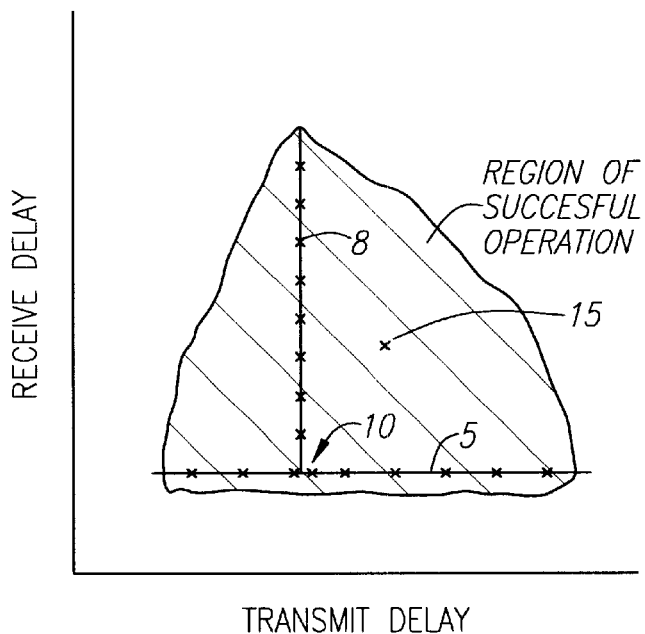
FIG. 1 is a shmoo plot for the delays used by a memory controller controlling an SDRAM device.
Figure 2:
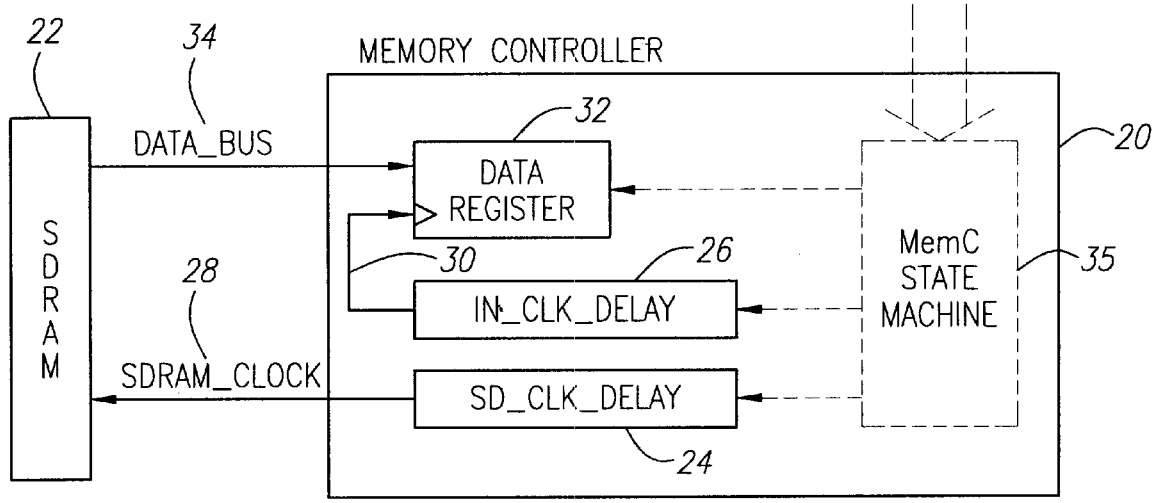
FIG. 2 is a block diagram for a memory controller according to one embodiment of the invention.

Referring now to FIG. 2, a memory controller 20 is illustrated according to one embodiment of the invention. As discussed herein, a multi-function processor will possess a CPU core (not illustrated) that can command the memory controller 20 to issue memory requests to the SDRAM device 22. The memory controller 20 receives a system clock signal that it may delay according to two delay buffers: a first delay buffer 24 for delaying the system clock signal to produce an SDRAM clock signal 28 for synchronizing the SDRAM device 22, and a second delay buffer 26 for delaying the system clock to produce a data latch input clock 30 for triggering a data latch 32 to latch data signals from the SDRAM device 22. These data signals are supplied on a data bus 34. For convenience, the amount of delay produced at the first delay buffer 24 may be denoted the SDRAM clock delay (SD_CLK) or tap value, whereas the amount of delay produced at the second delay buffer 26 may be denoted as the in clock delay (IN_CLK) or tap value. A state machine 35 within the memory controller 20 controls the IN_CLK and SD_CLK tap values as well as the operation of the data latch 32. In a memory controller 20 that does not automatically adjust the values of IN_CLK and SD_CLK, the CPU would, upon booting, read appropriate values of IN_CLK and SD_CLK from a boot ROM device and command the state machine 35 to configure the delay buffers 24 and 26 with these values. To avoid the laborious manual testing required to find appropriate values for IN_CLK and SD_CLK, a CPU core may be programmed to command the memory controller 20 to search for an optimal IN_CLK and SD_CLK pair.

Figure 3B:
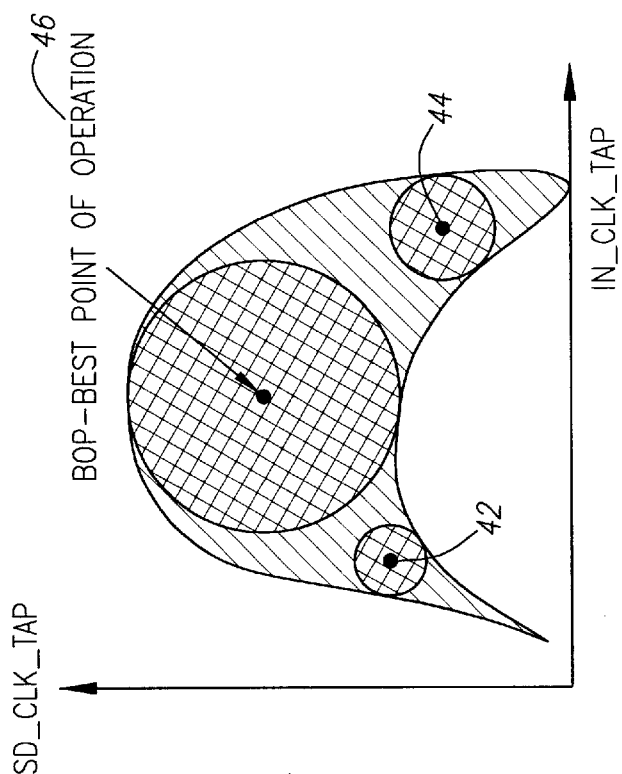
Figure 3A:
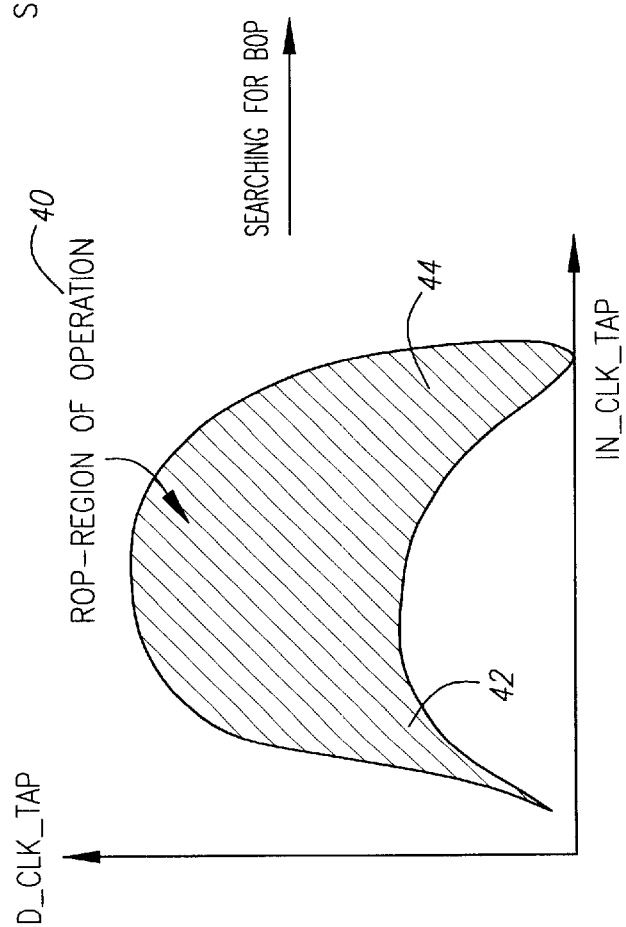
FIG. 3a is a shmoo plot for the delays used by a memory controller according to one embodiment of the invention.
Figure 4:
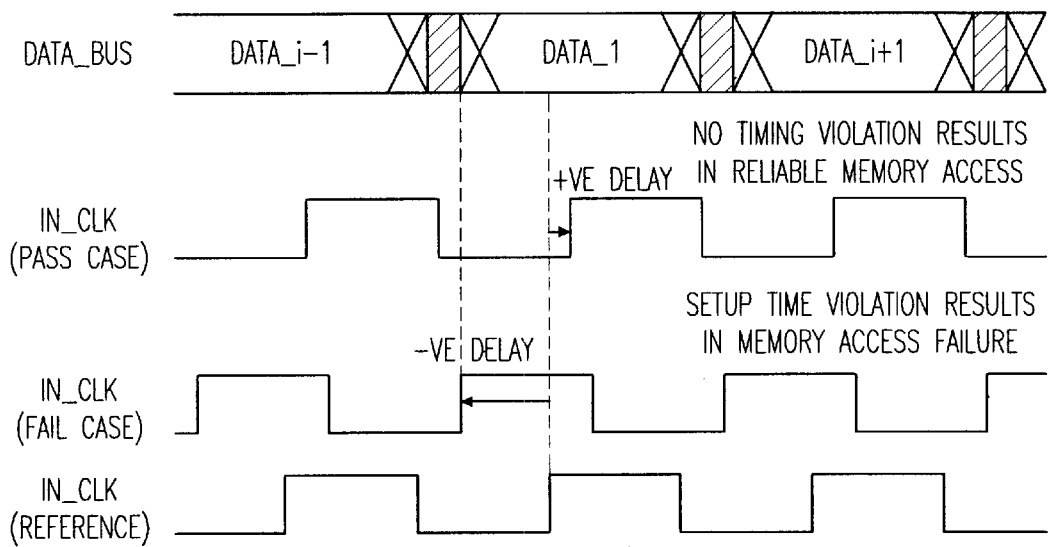
FIG. 4 illustrates a timing diagram for the data latch input clock delayed by various values of IN_CLK with respect to bit transitions on the data bus.

To program the CPU, a special boot code having a small footprint is placed in the boot ROM (not illustrated) to allow the CPU to boot upon reset. The boot code directs the CPU to run memory tests using various values of IN_CLK and SD_CLK. A given pair of IN_CLK and SD_CLK values will be deemed acceptable if the memory controller 20 can perform a suitable number of direct memory access (DMA) requests without detecting any errors. The plot of acceptable IN_CLK and SD_CLK values, denoted as the region of operation (ROP) 40 forms a shmoo plot as shown in FIG. 3a. The amount of total delay possibly commanded by the memory controller 20 for each tap value is determined by the period of the system clock. As a given tap value exceeds the clock period, its effect is no different than this tap value minus the clock period. For example, consider FIG. 4 illustrating a timing diagram for IN_CLK with respect to SDRAM data carried on the data bus 34. As discussed with respect to FIG. 2, the memory controller's data register 32 will latch the SDRAM data on the rising edge of its data latch input clock signal 30. Alternatively, the data register 32 could be configured to latch data on the falling edge of the data latch input clock signal 30. The clock signal 30 is delayed by the tap value IN_CLK with respect to the system clock. Assuming a latch at the rising edge configuration, the value of IN_CLK must, whether positive or negative, must be such that the input clock signal 30 does not have a rising edge at transitions between data signals on the data bus 34. Two sample values for IN_CLK are shown, one giving a positive delay resulting in a PASS case and the other giving a negative delay resulting in a FAIL case. Consider the PASS case value for IN_CLK. For data signal data_i, a positive delay value of IN_CLK results in the clock having a rising edge during a stable state of data_i, allowing it to be latched successfully. However, for the FAIL case value of IN_CLK having a negative delay value results in the clock having a rising edge during a transition between data_i-1 and data_i, preventing a successful latching of data_i. Effectively, the range of tap values for IN_CLK and SD_CLK may thus be normalized between 0 and 1, where a value of 1 represents the clock period. Various methods can be used to search the IN_CLK and SD_CLK tap value space between 0 and 1 for each variable to find acceptable values. For example, using normalized values, IN_CLK could be set to 0 and SD_CLK tested at discrete points between 0 and 1. Then IN_CLK would be incremented and SD_CLK varied again. This would be repeated until IN_CLK equaled 1. Clearly, minimizing the increments in IN_CLK and SD_CLK more accurately samples the region of operation. However, excessive sampling introduces delay in completing the testing. Typically, sampling each tap value at least 20 times at equal increments between 0 and 1, producing a shmoo plot sampled at 400 points is adequate. Having calculated a shmoo plot such as shown in FIG. 3a, the inventor has discovered a robust algorithm for calculating the best point of operation (BOP).

In one embodiment, the algorithm searches for the point about which the largest circle fits within the shmoo plot. As used herein, "within the shmoo plot" shall refer to points achieving acceptable SDRAM operation using the corresponding values of IN_CLK and SD_CLK. For example, FIG. 3b shows three points 42, 44, and 46 within the shmoo plot. At point 42, a comparably small circle fits within the shmoo plot. At point 44, a larger circle fits within the shmoo plot. Because this circle is larger than the one about point 42, it is more robust to changes in operating conditions that might shift an acceptable value for IN_CLK and SD_CLK into a failing value. At point 46, the largest circle exists that can fit within the shmoo plot. Thus, point 46 is the furthest point from the edge of the shmoo plot, making point 46 the most robust to changes in operating conditions. These changes in operating conditions include changes in temperature and aging that would affect the transmission parameters (e.g., capacitance) of the data bus 34 and the line carrying the SDRAM clock 28.

Figure 5:
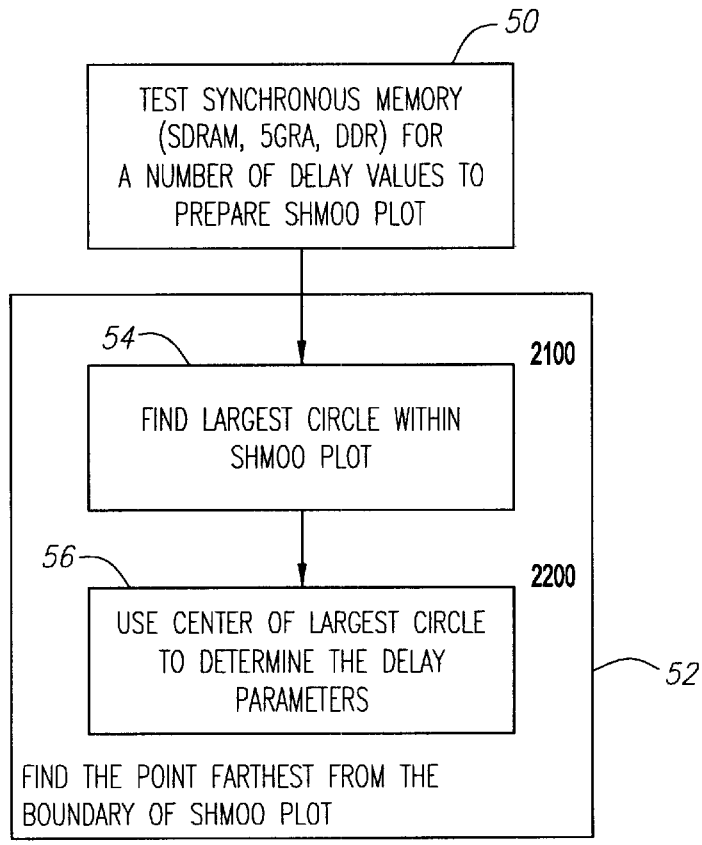
FIG. 5 is a flowchart illustrating one embodiment of the invention.

Turning now to FIG. 5, a flow chart for an embodiment of the invention is illustrated. At step 50, the CPU commands the memory controller 30 to test a variety of IN_CLK and SD_CLK values to form a shmoo plot. Note that as used herein, "forming a shmoo plot" shall mean testing points within the conceivable ranges for IN_CLK and SD_CLK to find passing and failing points as determined by whether the memory controller 20 can perform a successful memory request. The next step 52 finds BOP as determined by which point is furthest from the boundary of the shmoo plot. Step 52 comprises steps 54 and 56. Step 54 finds the largest circle that fits within the shmoo plot. Finally, step 56 uses the center point of the largest circle to establish BOP.

Figure 6:
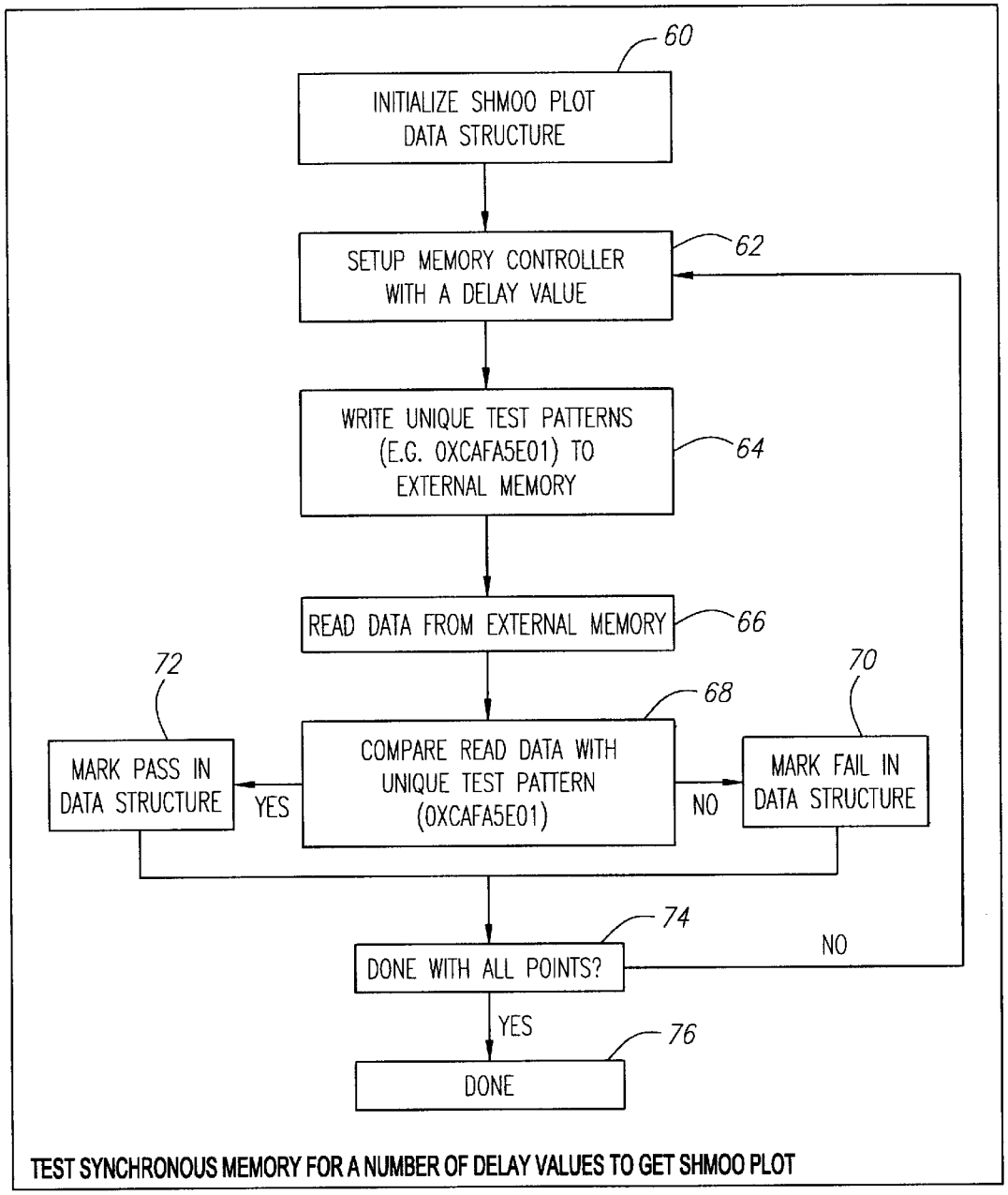
FIG. 6 is a flowchart illustrating an algorithm for testing whether a memory controller configured according to a delay pair successfully communicates with its memory device according to one embodiment of the invention.

Turning now to FIG. 6, a flowchart for the shmoo plot preparation of step 50 is illustrated. At step 60, a shmoo plot (x,y) data structure or array is initialized to zero. At step 62, the memory controller 20 sets up its delay buffers 24 and 26 with a IN_CLK and SD_CLK delay pair. At step 64, the memory controller tests these tap values by writing a unique test pattern, e.g, 0xcafe5a01 to the SDRAM device. The memory controller then determines if it can read this test pattern from memory at step 66. By comparing what was read with the test pattern written into memory, the CPU controller the memory controller determines if the test was successful at step 68. If it was successful, the CPU marks it as PASS in the data structure at step 72. Otherwise, at step 70, the CPU marks it as a FAIL in the data structure. After testing if all the points in the shmoo plot are tested at step 74, the test finishes at step 76. If points remain to be tested, the test begins again for one of the remaining points within the shmoo plot at step 62.

Figure 7:
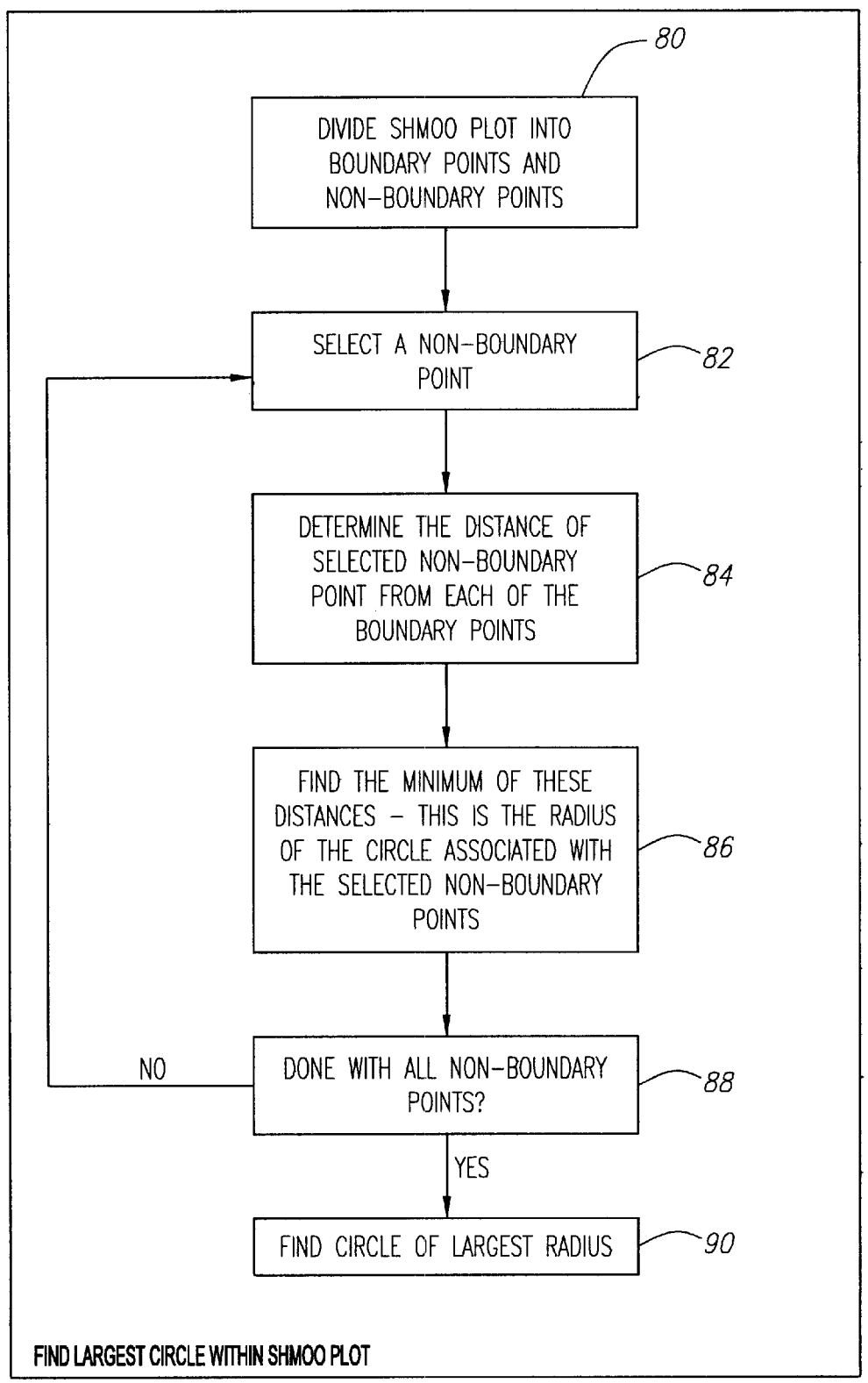
FIG. 7 is a flowchart illustrating an algorithm for selecting an optimal delay pair according to one embodiment of the invention.

Turning now to FIG. 7, an algorithm, shown as step 52 in FIG. 5, for locating the best point of operation (BOP) according to one embodiment of the invention is illustrated. The algorithm begins at step 80 by dividing the shmoo plot into boundary points and non-boundary points. Because a boundary point cannot be a BOP, the boundary points can immediately be eliminated from consideration as potential BOP locations. A method for dividing the shmoo plot into boundary and non-boundary points will be further discussed with respect to FIG. 8. Given the set of non-boundary points, an arbitrary point is selected at step 82 for testing. The distance from this point to each of the boundary points is determined at step 84. Determining the minimum of these distances at step 86 finds the radius of the circle that fits within the shmoo plot for the selected non-boundary point. A test is made at step 88 whether all the non-boundary points have been tested. If non-boundary points remain to be tested, one is selected and the algorithm begins again at step 82. Otherwise, the circle having the largest radius is selected at step 90. The non-boundary point associated with this circle is the BOP. It is possible that a plurality of points may each "tie" as having the circle of largest radius. In such a case, an arbitrary choice may be made, e.g., the first such point is chosen as the BOP.

Figure 8:
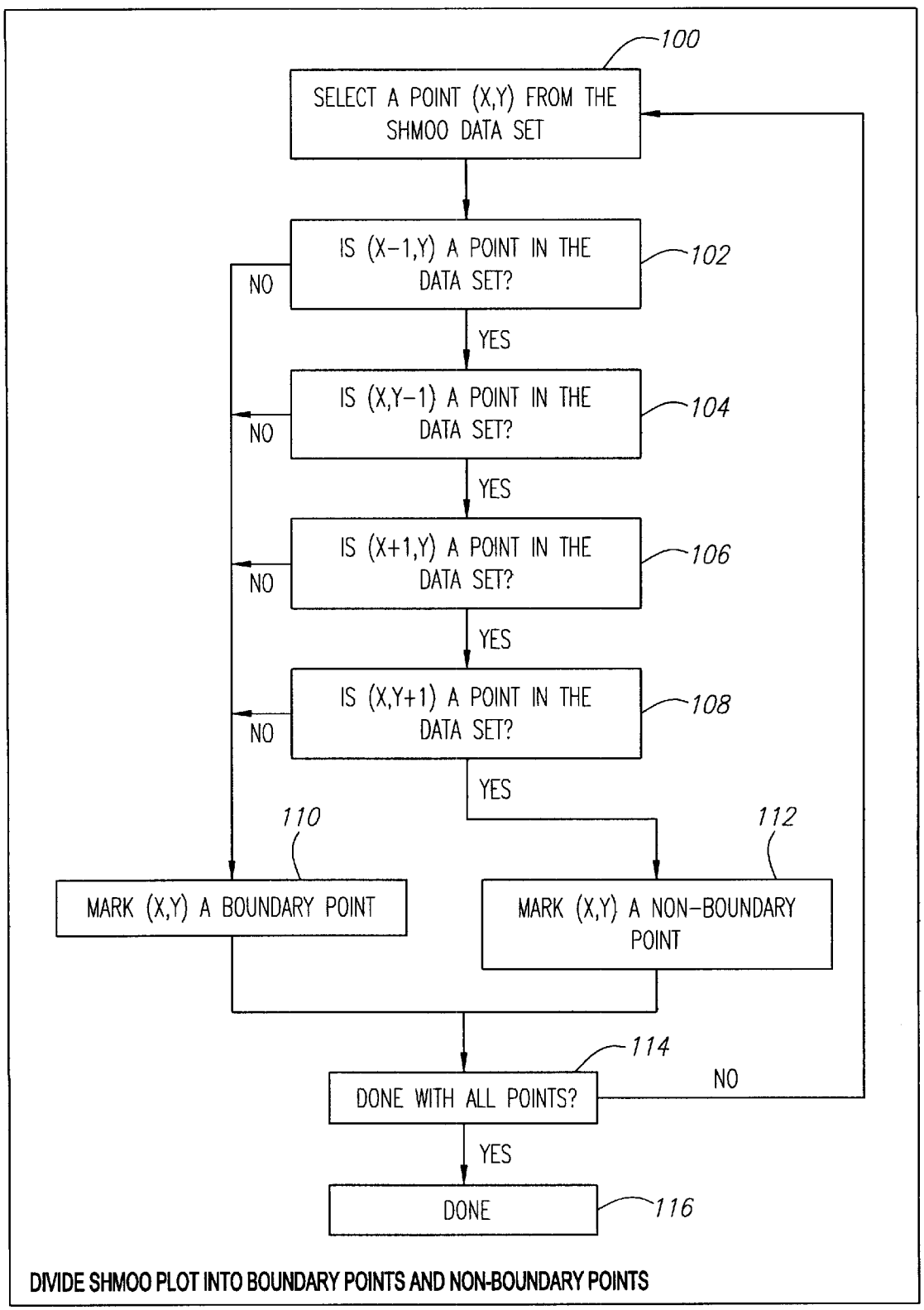
FIG. 8 is a flowchart illustrating an algorithm for dividing shmoo plot values into boundary and non-boundary sets according to one embodiment of the invention.

Turning now to FIG. 8, an algorithm for testing whether a point in the shmoo plot is a boundary point is illustrated, corresponding to step 80 of FIG. 7. The algorithm begins with a shmoo point (x,y) selection at step 100. The next four steps in the algorithm test the four Cartesian points about this (x,y) location. Thus, whether points (x−1,y), (x,y−1), (x+1,y), and (x,y+1) are within the schmoo plot are tested at steps 102, 104, 106, and 108, respectively. Should any of these tests fail, the point is marked as a boundary point at step 110. Otherwise, the point is marked as a non-boundary point at step 112. Whether all the points within the shmoo plot have been tested is determined at step 114. If points remain to be tested, one of the remaining points is selected at step 100 and the algorithm repeats. If no points remain to be tested, the algorithm exits at step 116.

Note that finding the shmoo point furthest from the boundary guarantees that this point corresponds to the most robust setting possible for IN_CLK and SD_CLK. However, other embodiments of the invention do not require this point to be selected. For example, a "sub-optimal" solution would be to select a delay parameter whose minimum distance relationship to boundary values satisfies an arbitrary threshold. The set of minimum values would be analyzed to determine the largest minimum value. Any point corresponding to a value satisfying, for example, 75% of this largest value would be selected as "optimal." One of ordinary skill will appreciate that many other embodiments lie within the scope of the invention.

Thus, although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A method for determining delays for a memory controller associated with a memory device, wherein the memory controller receives a system clock and communicates with the memory device according to a first delay and a second delay with respect to the system clock, comprising:

testing a plurality of first delay and second delay pairs to determine if the memory controller successfully communicates with the memory device at each delay pair, thereby determining a set of successful delay pairs;

dividing the set of successful delay pairs into a boundary set and a non-boundary set; and selecting a delay pair from the non-boundary set as determined by its relationship to the delay pairs in the boundary set.

2. The method of claim 1, wherein the selecting a delay pair act comprises:

(a) determining the minimum distance from each delay pair within the boundary set to delay pairs within the non-boundary set; and (b) selecting the delay pair as the delay pair from act (a) having the largest minimum distance.

3. The method of claim 2, further comprising the act of configuring the memory controller to communicate with the memory device according to the selected delay pair.

4. The method of claim 3, wherein the memory device is a SDRAM device.

5. The method of claim 4, wherein the testing a plurality of selected first delay and second delay pairs determines whether, at each delay pair, the memory controller successfully communicates with the memory device by performing a series of direct memory access requests.

\* \* \* \* \*